United States Patent
Khamene et al.

(10) Patent No.: US 7,711,405 B2
(45) Date of Patent: May 4, 2010

(54) METHOD OF REGISTERING PRE-OPERATIVE HIGH FIELD CLOSED MAGNETIC RESONANCE IMAGES WITH INTRA-OPERATIVE LOW FIELD OPEN INTERVENTIONAL MAGNETIC RESONANCE IMAGES

(75) Inventors: Ali Khamene, Princeton, NJ (US); Frank Sauer, Princeton, NJ (US)

(73) Assignee: Siemens Corporation, Iselin, NJ (US)

( * ) Notice: Subject to any disclaimer, the term of this patent is extended or adjusted under 35 U.S.C. 154(b) by 864 days.

(21) Appl. No.: 10/833,742

(22) Filed: Apr. 28, 2004

(65) Prior Publication Data

US 2005/0245810 A1    Nov. 3, 2005

(51) Int. Cl.
*A61B 5/05* (2006.01)

(52) U.S. Cl. .................. 600/407; 600/410; 600/427; 382/128; 382/130

(58) Field of Classification Search .......... 600/410, 600/407, 424; 382/132, 282, 284, 294; 324/307, 324/309

See application file for complete search history.

(56) References Cited

U.S. PATENT DOCUMENTS

| | | | |
|---|---|---|---|
| 3,703,174 A | 11/1972 | Smith | |
| 4,453,930 A | 6/1984 | Child | |
| 4,935,027 A | 6/1990 | Yoon | |
| 5,350,385 A | 9/1994 | Christy | |
| 5,800,352 A * | 9/1998 | Ferre et al. | 600/407 |
| 5,871,445 A * | 2/1999 | Bucholz | 600/407 |
| 6,090,063 A | 7/2000 | Makower et al. | |
| 6,139,520 A | 10/2000 | McCrory et al. | |
| 6,236,875 B1 * | 5/2001 | Bucholz et al. | 600/407 |
| 6,295,464 B1 * | 9/2001 | Metaxas | 600/407 |
| 6,296,632 B1 | 10/2001 | Luscher et al. | |
| 6,373,998 B2 * | 4/2002 | Thirion et al. | 382/294 |
| 6,440,098 B1 | 8/2002 | Luscher | |
| 6,563,941 B1 | 5/2003 | O'Donnell et al. | 382/131 |
| 6,687,527 B1 * | 2/2004 | Wu et al. | 600/410 |
| 6,690,816 B2 * | 2/2004 | Aylward et al. | 382/128 |
| 6,775,404 B1 * | 8/2004 | Pagoulatos et al. | 382/154 |
| 2004/0167547 A1 | 8/2004 | Beane et al. | |

(Continued)

FOREIGN PATENT DOCUMENTS

WO    WO 00/67643    11/2000

(Continued)

OTHER PUBLICATIONS

Raj Shekhar et al. Mutual Information-Based Rigid and Nonrigid Registration of Ultrasound Images, Jan. 2002, IEEE.*

(Continued)

*Primary Examiner*—Brian Casler
*Assistant Examiner*—Joel M Lamprecht

(57) ABSTRACT

A system and method for registering pre-operative magnetic resonance (MR) images with intra-operative MR images is disclosed. A pre-operative MR image of an object is received. A set of intra-operative MR images of the object is received. The pre-operative MR image is rigidly registered with the initial intra-operative MR image. The subsequent set of intra-operative images is deformably registered. The pre-operative MR image undergoes both rigid and deformation transformation to match specification of each image with in intra-operative MR image set.

7 Claims, 4 Drawing Sheets

U.S. PATENT DOCUMENTS

2006/0239519 A1* 10/2006 Nowinski et al. ........... 382/128

FOREIGN PATENT DOCUMENTS

WO  WO2004/034867 A3  4/2004
WO  WP2004/098420 A2  11/2004

OTHER PUBLICATIONS

Calvin. R. Maurer Jr. et al. Investigation of Intraoperative Brain Deformation Using a 1.5-T Interventional MR System: Preliminary Results, Oct. 1998, IEEE.*
Philippe Thevenaz et al. A Pyramid Approach to Subpixel Registration Based on Intensity, Jan. 1998, IEEE.*
Michael Miga et al. In vivo Quantification of a Homogeneous Brain Deformation Model for Updating Preoperative Images During Surgery, Feb. 2000, IEEE.*
Andres Carrillo et al. Semiautomatic 3-D Image Registration as Applied to Interventional MRI Liver Cancer Treatment, Mar. 2000, IEEE.*
Daniel et al., "Intraoperative MR Imaging: Can Image Guidance Improve Therapy", Academic Radiology, AR 2002, Aug. 2002, pp. 875-878.
Hirose et al., "Feasibility of MR imaging-guided breast lumpectomy for malignant tumors in a 0.5-T open-configuration MR imaging system", Acad. Radiol. 2002; 9:933-941.
Hirose et al., "Quantitative MR imaging assessment of prostate gland deformation before and during MR imaging-guided brachytherapy", Acad Radiol. 2002; 906-912.
Gould et al., Interventional MR-guided excisional biopsy of breast lesions, Magn Reson Imaging 1998; 8:26-30.
D'Amico et al., Real-time magnetic resonance image-guided interstitial brachytherapy in the treatment of select patients with clinically localized prostate cancer, Int J Radiat Oncol Bio Phys 1998; 42:507-515.
Bharatha et al., "Evaluation of three-dimensional finite element-based deformable registration of pre- and intraoperative prostate imaging", Med Phys 2001; 28:2551-2560.
Rogelja et al., "Validation of a Non-rigid Registration Algorithm for Multi-modal Data", SPIE 2002, San Diego, CA.
Periaswamy et al., "Elastic Registration in the Presence of Intensity Variations".
Wells III et al., "Multi-modal volume registration by maximization of mutual information".
Hill et al., "Measuring tissue deformation with interventional MR".
"Interventional MR imaging ", http://www.amershamhealth.com/medcyclopaedia/Volume%201/INTERVENTIONAL%2 . . . .

* cited by examiner

METHOD OF REGISTERING PRE-OPERATIVE HIGH FIELD CLOSED MAGNETIC RESONANCE IMAGES WITH INTRA-OPERATIVE LOW FIELD OPEN INTERVENTIONAL MAGNETIC RESONANCE IMAGES

FIELD OF THE INVENTION

The present invention is directed to a method of registering pre-operative Magnetic Resonance Images (MRIs) with intra-operative MRIs, and more particularly, to a method of registering pre-operative high field closed MRIs with intra-operative low field open MRIs.

BACKGROUND OF THE INVENTION

MRI, because of its high tissue contrast and spatial resolution as well as multiplanar and functional imaging capabilities, has the most appeal for monitoring and controlling therapy. Open magnets, which allow some sort of access to the patient and are equipped with a navigation system, can provide an interactive environment in which biopsies, percutaneous or endoscopic procedures, and minimally invasive interventions or open surgeries can be performed. In addition, various thermal ablations with image-based control of energy deposition can be performed to exploit the intrinsic sensitivity of MRI to both temperature and tissue integrity. The drawback of using interventional open MR is that, almost all of the introduced open magnets are low field and in turn the quality of the images are considerably lower comparing to high field closed magnet counterparts. Therefore, for a number of procedures, where the tissue contrast and quality of the image is vital, the low field MR, although greatly facilitates the tissue/lesion localization, cannot be effectively utilized.

Indeed, in breast cancer, prostrate cancer and brain tumor procedures, preoperative imaging depicts tumor extent better because of the ability to perform dynamic imaging, parametric modeling, and diffusion or other functional MR imaging methods with acquisition times that would be impractical for interactive intra-procedural imaging. The ultimate goal in these procedures would be to have both the fast acquisition and patient accessibility of the open magnet interventional MR and the image quality and tissue contrast of the closed magnet MR.

Interventional and surgical procedures require the physician to have access to updates about the patient anatomy or changing position of movable organs. Near real-time imaging during intervention (without registration) establish the necessary relationship between the patient and the images. The lower image quality of the open magnets prohibits their usage for a variety of the procedures. There is a need for a registration procedure, which augments open magnet intra-operative image (volume is considered to be three-dimensional image and is referred to as image hereafter) with high quality pre-operative images from conventional high field magnet MRI system.

SUMMARY OF THE INVENTION

A system and method for registering pre-operative magnetic resonance (MR) image with intra-operative MR image is disclosed. A pre-operative MR image of an object is received. An intra-operative MR image of the object is received. The pre-operative MR image is rigidly registered with the intra-operative MR image. Subsequent intra-operative MR images are deformably registered with the first set of intra-operative MR image and consequently with the pre-operative MR image.

BRIEF DESCRIPTION OF THE DRAWINGS

Preferred embodiments of the present invention will be described below in more detail, wherein like reference numerals indicate like elements, with reference to the accompanying drawings.

DETAILED DESCRIPTION

Figure 1:
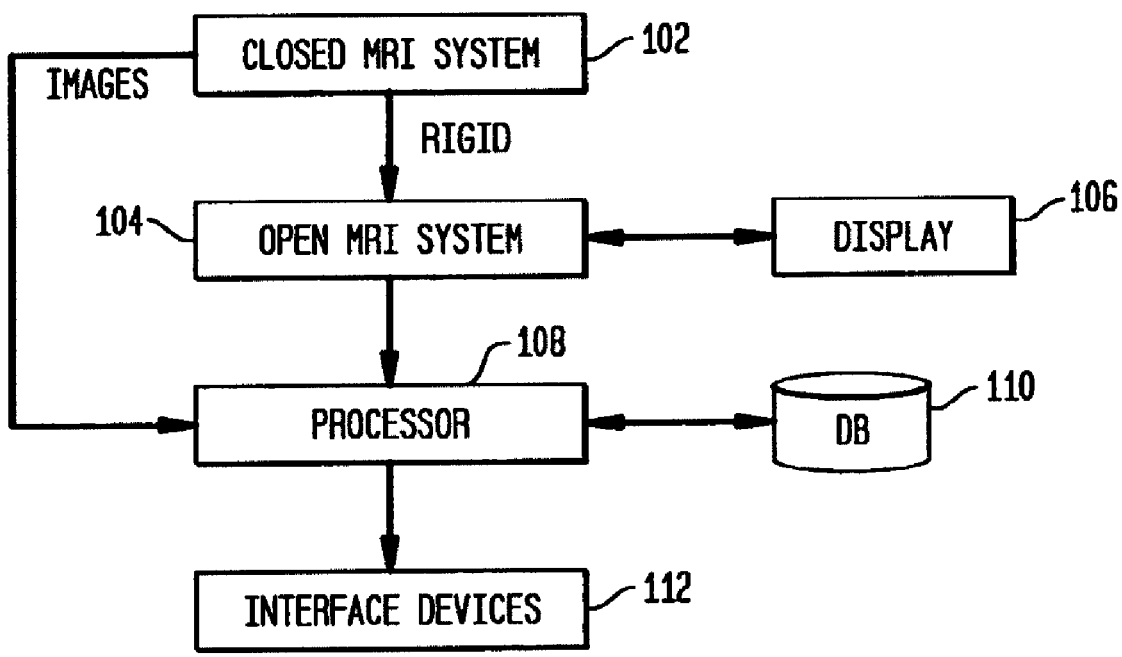
FIG. 1 is a schematic block diagram of an illustrative system for implementing a method of registering pre-operative high field MR images with intra-operative low field MR images in accordance with the present invention.

The present invention is directed to a method for registering pre-operative high field MR images with intra-operative low field MR images. FIG. 1 illustrates a schematic block diagram of an illustrative system for implementing the method of the present invention. The present invention exploits the pre-operative image and intra-operative image to provide a more useful and inexpensive registered image of an organ, which is the subject of a minimally invasive therapeutic intervention. For example, a tumor can be imaged both pre-operatively using a closed MRI system and intra-operatively using an open MRI system. The images are registered and merged to provide both structural and functional information about the tumor and the effected organ. Subsequent images taken intra-operatively using the open MRI system can then be merged with the pre-operative image over time to assist the physician. Based on deformations detected intra-operatively, the present invention can be used to modify the pre-operative image to emulate these deformations prior to registration with the intra-operative images.

A Magnetic Resonance Image (MRI) of desired tissue region or an organ is obtained by employing a closed MRI system 102 such as, for example, a 1.5 T MAGNETOM Sonata scanner, commercially available from Siemens Medical Solutions. Data is collected for an image of the tissue region or organ and stored for further processing by processor 108. This image is obtained prior to any operative procedure. Other organs or internal structures may also be imaged as needed.

A MRI of the same desired tissue region or organ is then obtained by employing an open MRI system 104 such as, for example, a 1 T MAGNETOM Rhapsody scanner, commercially available from Siemens Medical Solutions. During the operative procedure, an initial image is obtained and stored in processor 108. Rigid registration of the image from the open MRI and the image from the closed MRI is performed. Preferably, the image taken by the closed MRI and the initial image taken by the open MRI are in a relatively similar state. For example, an internal organ that is imaged should be in approximately the same state for both imaging processes to ensure proper registration.

Two scenarios can be considered. First in abdominal and thoracic procedures, the rigidity of the internal organ movement can be assured using either breath-hold techniques or gating techniques (e.g., both the pre-procedural and first set of intra-procedural image is taken at the full inhalation). Second for neurosurgical procedures, only after craniotomy, there exists some deformable movement of the structure, which is so-called brain-shift. Therefore, the rigidity assumption for this stage is quite reasonable.

As indicated above, the image data from the closed MRI system and the open MRI system are input to processor 108. Processor 108 may include a Graphical User Interface (GUI), which permits a user to manually draw a border or contour around a region of interest in the MR images. Alternatively, a segmentation algorithm may be employed to differentiate regions of interest and draw contours for MR images without user interaction. Segmentation algorithms known to those skilled in the art may be employed. Processor 108 includes a database 110 that stores the images.

A display 106 is included for displaying the images and displaying the registered images. An interface device or devices 112 are also included such as a keyboard, mouse or other devices known in the art.

Figure 2:
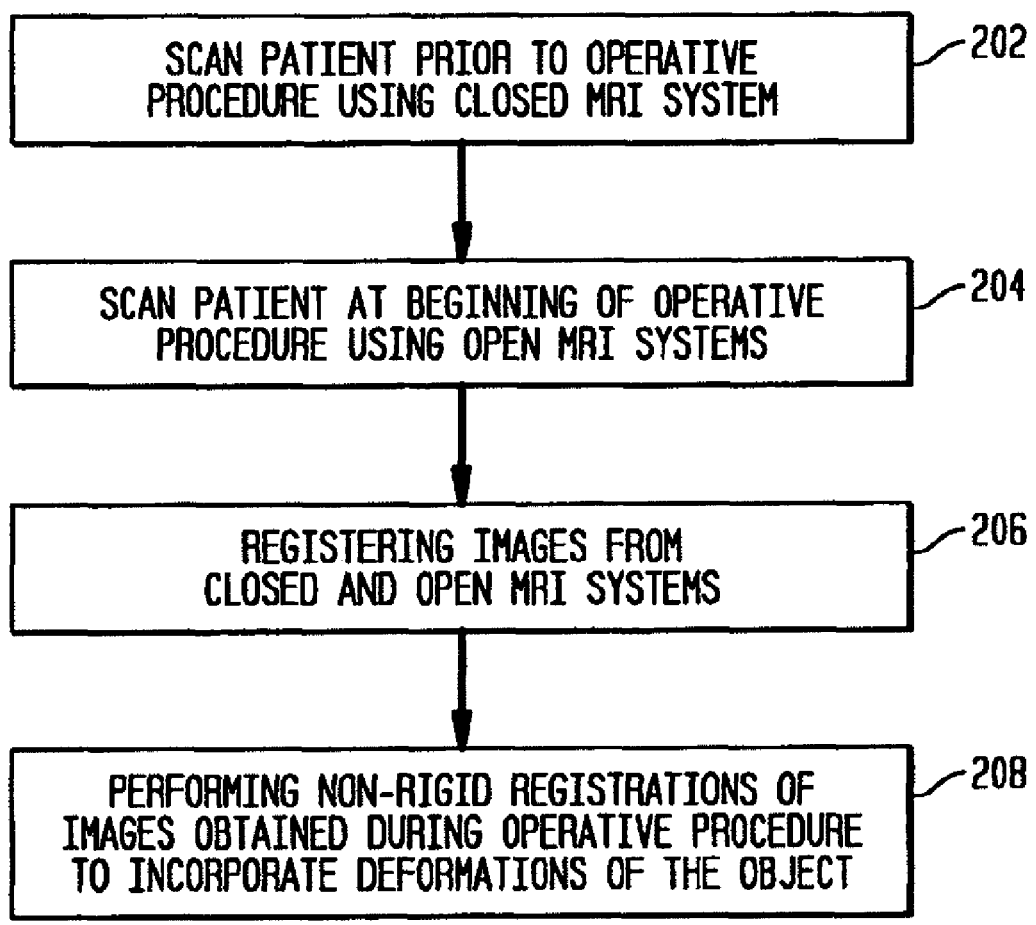
FIG. 2 is a flow diagram illustrating a method for registering pre-operative high filed MR images with intra-operative low field MR images in accordance with the present invention.
Figure 3:
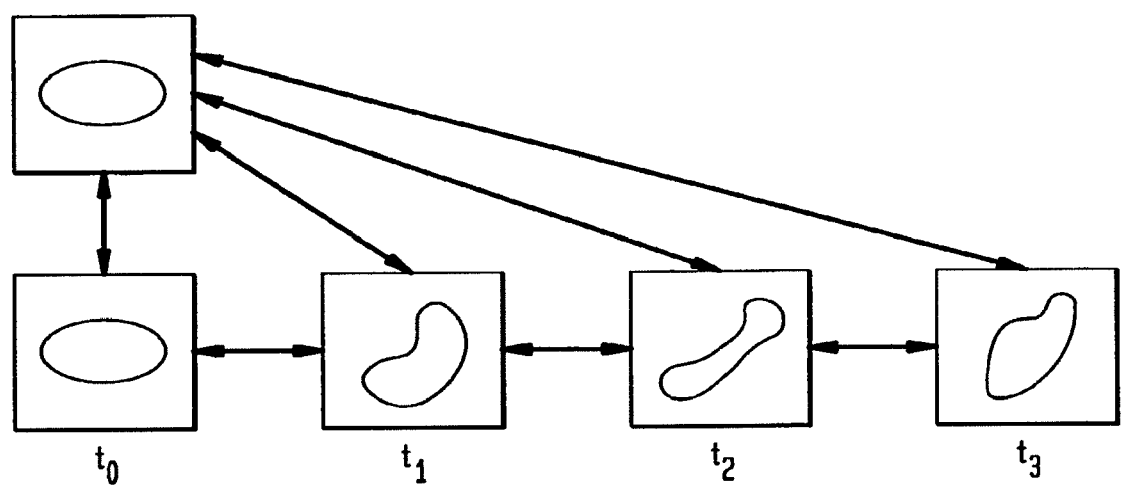
FIG. 3 is a block diagram illustrating the method of FIG. 2 in accordance with the present invention.

FIG. 2 is a flow chart that illustrates a method for registering pre-operative high field MR images with intra-operative low field MR images in accordance with the present invention. A patient undergoes a MRI scan prior to an operative procedure via a high field closed MRI system (step 202). The image from the scan is stored for later usage. Next, the patient is scanned at the beginning of the operative procedure using a low field open MRI system (step 204). Preferably, the patient is positioned in essentially the same position as when the patient was scanned by the closed MRI system and the angle and perspective of the scans are similar. The image from the open MRI scan is stored as well.

The processor registers the closed MR images with the open MR images (step 206). Typically rigid registration of the closed MR image and open MR image is performed. This is based on the assumption that the intra-procedural changes in the anatomy (e.g., craniotomy for neurosurgical applications) are the major cause of the deformation (e.g., brain shift). Rigid registration technologies have been matured enough to be able to deal with multi-modal registration rather robustly. An example of an approach for performing the rigid registration of the two images is described in an article entitled "Multi-Modal Volume Registration by Maximization of the Mutual Information" by William M. Wells III et al. Medical Image Analysis, 1(1):35-51 (1996) which is incorporated by reference in its entirety.

The registered images allow for the details associated with the closed MR image to be incorporated with the current lower resolution open MR image. By registering the two images, an initialization can be performed in which the images are aligned. The details of the closed MR image can be incorporated into the later views provided by the open MR system as will be described in more detail hereinafter.

During the operative procedure, additional scans are performed by the open MRI system. Non-rigid registration of the subsequent open MR image and the closed MR image is performed to account for deformations in the object being imaged (step 208). Such deformations can occur due to the insertion of a needle into the object, the patient's breathing or other movement resulting in deformation (e.g., brain shift).

Consequent non-rigid deformations of the pre-operative data set can be computed based on the deformations from the intra-operative updates acquired using the open MRI system throughout the procedure. The deformation fields are computed in between the data sets acquired from the same open MRI system. This can be achieved by utilizing a non-rigid deformation algorithm.

A non-rigid deformation algorithm yields a deformation field that relates each pixel of the source image to that of the target. Robustness of non-rigid registration algorithm is maximized at the cases where, the source and target datasets are radiometrically identical. This ensures that the variation of the local measure of similarity between the two datasets is strictly due to the geometrical (grid deformation). Therefore, in this application the non-rigid registration algorithm is more effective (comparing to other ones involving multimodal data sets and/or mono-modal sets from various scanners) because the structural information and noise level of one data set matches one another. An example of a non-rigid registration algorithm, which can be used, is described in S. Periaswamy and H. Farid. "Elastic registration in the presence of intensity variations", *IEEE Transactions on Medical Imaging*, in press, 2003 which is incorporated by reference in its entirety.

The open MRI system is used as a localizer, such that geometric information is weighted much higher than radiometric information. Therefore, it is possible to use a smaller magnet with a weaker field to obtain the required information thereby reducing the cost of the system. The present invention can also accommodate other modality information, which may be taken or scanned pre-operatively. The use of the open MRI system allows for each access to the patient during the operative procedure. The method of the present invention allows for nearly real time acquisition of update scans during the operative procedure. The lower quality image obtained by the open MRI system is enhanced with the higher quality image obtained pre-operatively using the closed MRI system.

Figure 4:
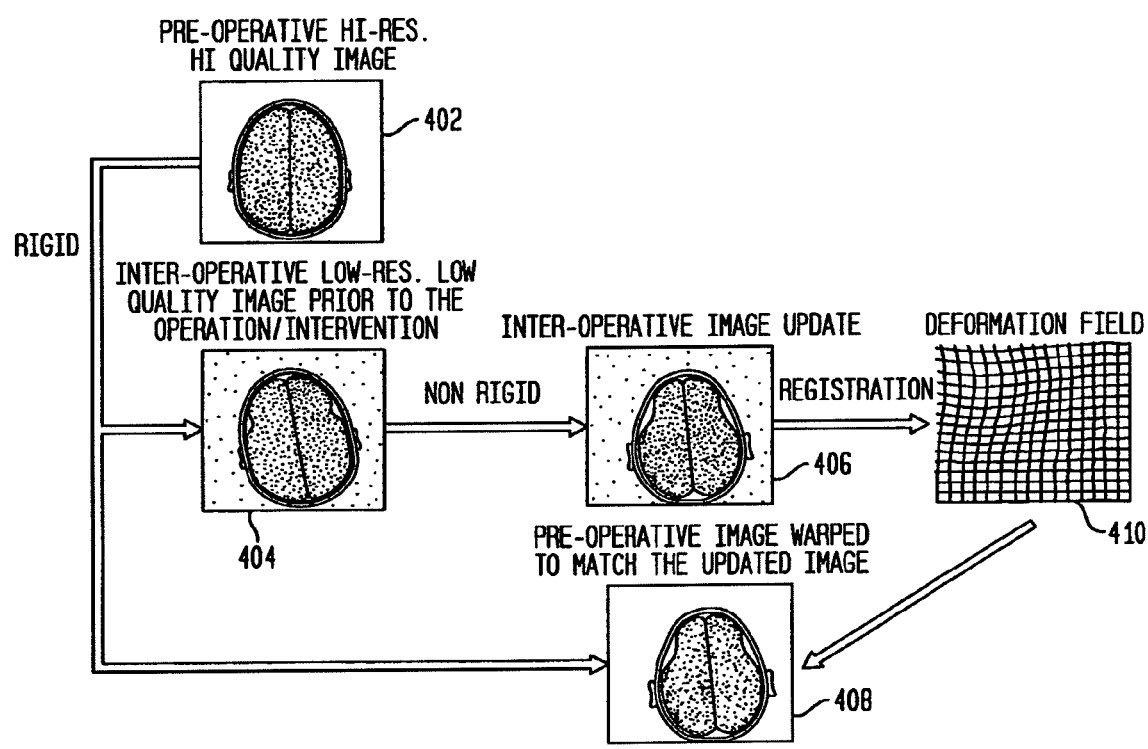
FIG. 4 is a flow diagram that illustrates a process for rigid and deformable (non-rigid) registration of pre-operative and intra-operative MR images in accordance with the present invention.

FIG. 4 illustrates a series of MR images that have been taken pre-operatively and intra-operatively in accordance with the present invention. An MR image 402 is scanned pre-operatively using a high-resolution closed MRI scanner. A second MR image 404 is scanned intra-operatively using a low-resolution open MRI scanner. The MR images 402, 404 are registered using a rigid resolution algorithm.

The intra-operative image is updated during the procedure resulting in MR image 406. A deformation field 410 is the result of performing non-rigid registration of the updated MR image 406 and MR image 404. The pre-operative image 402 is warped to match the more current intra-operative image 406 using both the rigid transformation acquired between MR images 402 and 404 and the deformation field 410.

This process is repeated for each additional MR image that is scanned during the procedure.

Having described embodiments for a method for detecting and tracking vehicles, it is noted that persons skilled in the art in light of the above teachings can make modifications and variations. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

We claim:

1. A computer implemented method for registering a pre-operative image with an intra-operative image comprising the steps of:

receiving a pre-operative, high-resolution image of an object;

obtaining an initial intra-operative, low-resolution image of the object;

rigidly registering the pre-operative high-resolution image with the initial intra-operative low-resolution image;

during an operative procedure, acquiring a plurality of successive updated intra-operative low-resolution images;

non-rigidly registering each updated intra-operative low-resolution image with the initial intra-operative low-resolution image to determine an incremental deformation field, wherein the non-rigid registration of the updated image reconciles deformations of the object; and warping the pre-operative high-resolution image using the rigid registration and the each incremental deformation field to match to an anatomy as presented by the each updated intra-operative low-resolution image, wherein the warped pre-operative high-resolution image is merged with each updated intra-operative low-resolution image, wherein details associated with the pre-operative high-resolution image are incorporated into the intra-operative low-resolution images.

2. The method of claim 1 wherein voxels of the intra-operative images, which are subject to deformable registration process, are substantially radiometrically identical.

3. A computer implemented system for registering pre-operative magnetic resonance (MR) images with intra-operative MR images comprising:

a low resolution magnetic resonance imaging (MRI) system;

a processor for receiving p, pre-operative images of an object generated by a high resolution MRI system and intra-operative images generated by the low resolution MRI system, the processor adapted to performing the following steps during an operative procedure:

rigidly registering the pre-operative MR image with the initial intra-operative MR image;

acquiring a plurality of subsequent intra-operative MR images;

non-rigidly registering each subsequent MR images with the initial intra-operative MR image to determine an incremental deformation field, wherein said deformation field relates each image pixel of each subsequent MR image to that of the initial intra-operative MR, and wherein the non-rigid registration of each subsequent MR images reconciles deformations of the object; and warping the pre-operative MR image using the rigid registration and the incremental deformation field to match to the most recent state of anatomy as presented by the most recent subsequent intra-operative MR image, wherein the warped pre-operative MR image is merged with the most recent subsequent intra-operative image, wherein details associated with the pre-operative MR image are incorporated into the most recent subsequent intra-operative image;

a database for storing the pre-operative, intra-operative and registered images; and a display for displaying the images.

4. The system of claim 3 wherein the low resolution MRI system is an open MRI system.

5. The system of claim 3 wherein the high resolution MRI system is a closed MRI system.

6. The system of claim 3 wherein voxels of the intra-operative images, which are subject to deformable registration process, are substantially radiometrically identical.

7. A program storage device readable by a computer, tangibly embodying a program of instructions executable by the computer to perform the method steps for registering a pre-operative image with an intra-operative image, the method comprising the steps of:

receiving a pre-operative, high-resolution image of an object;

obtaining an initial intra-operative, low-resolution image of the object;

rigidly registering the pre-operative high-resolution image with the initial intra-operative low-resolution image;

during an operative procedure, acquiring a plurality of successive updated intra-operative low-resolution images;

non-rigidly registering each updated intra-operative low-resolution image with the initial intra-operative low-resolution image to determine an incremental deformation field, wherein the non-rigid registration of the updated image reconciles deformations of the object; and warping the pre-operative high-resolution image using the rigid registration and each incremental deformation field to match to an anatomy as presented by the each updated intra-operative low-resolution image, wherein the warped pre- operative high-resolution image is merged with each updated intra-operative low-resolution image, wherein details associated with the pre-operative high-resolution image are incorporated into the intra-operative low-resolution images.

* * * * *